(12) United States Patent
Mattheijssen et al.

(10) Patent No.: US 7,755,444 B2
(45) Date of Patent: Jul. 13, 2010

(54) POLAR MODULATION APPARATUS AND METHOD USING FM MODULATION

(75) Inventors: Paul Mattheijssen, Eindhoven (NL); Dominicus Martinus Wilhelmus Leenaerts, Riethoven (NL)

(73) Assignee: ST-Ericsson SA, Geneva (CH)

( * ) Notice: Subject to any disclaimer, the term of this patent is extended or adjusted under 35 U.S.C. 154(b) by 64 days.

(21) Appl. No.: 12/090,727

(22) PCT Filed: Oct. 18, 2006

(86) PCT No.: PCT/IB2006/053837

§ 371 (c)(1),
(2), (4) Date: Apr. 18, 2008

(87) PCT Pub. No.: WO2007/046061

PCT Pub. Date: Apr. 26, 2007

(65) Prior Publication Data

US 2008/0266015 A1    Oct. 30, 2008

(30) Foreign Application Priority Data

Oct. 21, 2005 (EP) .................................. 05109822

(51) Int. Cl.
H03C 3/02 (2006.01)
H03C 3/40 (2006.01)
(52) U.S. Cl. ...................................... 332/145; 332/151
(58) Field of Classification Search ................. 332/103, 332/117, 119, 120, 145, 151; 375/295, 298
See application file for complete search history.

(56) References Cited

U.S. PATENT DOCUMENTS 5,705,959 A * 1/1998 O'Loughlin ................ 332/151
2003/0078016 A1 * 4/2003 Groe et al. ................... 455/91
2004/0212445 A1 10/2004 Haglan
2005/0237121 A1 * 10/2005 Hirano et al. ................ 331/16

FOREIGN PATENT DOCUMENTS

| | | | |
|---|---|---|---|
| GB | 2389255 | A | 12/2003 |
| JP | 05175743 | A | 7/1993 |
| JP | 10304000 | A | 11/1998 |
| JP | 2000115264 | A | 4/2000 |
| JP | 2003-500931 | | 1/2003 |
| JP | 2004088803 | A | 3/2004 |
| JP | 2005295536 | A | 10/2005 |
| WO | WO 00/72542 | A1 | 11/2000 |

OTHER PUBLICATIONS

Elliott, M. R; et al "A Polar Modulator Transmitter for GSM/Edge" IEEE Journal of Solid-State Circuits, vol. 39, No. 12, December 2004, pp. 2190-2199.

* cited by examiner

*Primary Examiner*—Robert Pascal
*Assistant Examiner*—Ryan Johnson

(57) ABSTRACT

The present invention relates to a polar modulation apparatus and method, in which an in-phase and a quadrature-phase signal are processed in the analog domain to generate an analog signal corresponding to a derivative of a phase component of said polar-modulated signal. The analog signal is then input to a control input of a controlled oscillator (40). As an example, the processing may be based on a differentiate-and-multiply algorithm in the analog domain. Thereby, phase and envelope signals are generated in the analog domain and bandwidth enlargement due to the processing of the polar signals and corresponding aliasing can be prevented to obtain a highly accurate polar-modulated output signal.

20 Claims, 3 Drawing Sheets

POLAR MODULATION APPARATUS AND METHOD USING FM MODULATION

CROSS-REFERENCE TO RELATED APPLICATION(S)

The present application claims priority under 35 U.S.C. §365 to International Patent Application No. PCT/IB2006/053837 filed Oct. 18, 2006, entitled "POLAR MODULATION APPARATUS AND METHOD USING FM MODULATION". International Patent Application No. PCT/IB2006/053837 claims priority under 35 U.S.C. §365 and/or 35 U.S.C. §119(a) to European Patent Application No. 05109822.6 filed Oct. 21, 2005 and which are incorporated herein by reference into the present disclosure as if fully set forth herein.

BACKGROUND

In current power amplifier (PA) designs, linearity and power efficiency are important requirements. In fact, the design space of a PA consists of several parameters affecting the linearity and efficiency requirements, such as compression point, output power, available gain or accuracy, which can be expressed by an error vector magnitude (EVM). It is very hard to find an optimal designed amplifier because it exists a trade-off between some of the parameters, so that not all of them can be optimized at the same time. For instance, efficiency and linearity requirements are two contradictory requirements. In principle, increased linearity for high power levels results in less power efficiency and, on the other hand, increased efficiency for low power levels results in poor linearity. The above problem becomes even more demanding for wireless communication systems having amplitude and phase modulation, e.g., quadrature amplitude modulation (QAM). Especially for wireless communication systems using orthogonal frequency division multiplex (OFDM) as modulation scheme, the above problem gets even worse due to the fact that OFDM signals possess high peak to average ratios (e.g. 10 dB) which imposes another parameter on the PA design. Such high peak to average ratio requires class A and AB driving schemes for the PAs of these OFDM communication systems. However, using class A and AB leads to a significant reduction of efficiency of the PAs.

As an example, Wireless Local Area Network (WLAN) PAs need to provide power levels in the order of 19 to 21 dBm at the output and have to meet EVM requirements with a power aided efficiency (PAE) of 20 percent or higher.

In order to solve the above efficiency requirements, polar modulation technology has been developed to facilitate system design. A polar modulator can independently process a carrier's amplitude and phase signals, typically working together with a non-linear power amplifier operating in switched mode. The elimination of the linear operation requirement enables power amplifier efficiency to be maximized for each modulation standard. Under a polar modulation scheme, multimode operation may be achieved by digital switching. Phase information is used to tune a voltage-controlled oscillator (VCO) driving the PA, while amplitude information modulates the PA according to the required standard. Consequently, when using polar modulation, the complex baseband signal is split up into phase and amplitude components which are combined at the output stage.

US 2004/0212445 A1 discloses a method and apparatus for polar modulation where in-phase (I) component and quadrature-phase (Q) component are digitally processed to produce digital envelope or magnitude and phase signals. In the phase signal path, the phase signal is converted to a baseband frequency signal by taking the derivative of the phase with a digital derivative circuit. Furthermore, a digital time delay circuit is used or controlled to synchronize the phase path with the magnitude path where the magnitude signal is differentiated and converted to an analog signal used to drive the PA. The digital baseband frequency signal is then supplied to a fractional divider circuit of a phase locked loop (PLL) arrangement to generate a sinusoidal wave. The above additional digital processing in the magnitude and phase paths leads to improved signal quality in the described polar modulation system.

However, conversion of Cartesian signals, such as in-phase (I) and quadrature-phase (Q) signals, to polar signals usually requires a non-linear operation. Due to that, the bandwidth of the envelope and phase component of the polar signal is significantly enlarged up to 5 or 8 times the bandwidth of the Cartesian signals. In the digital domain this would lead to additional aliasing, which increases EVM.

SUMMARY

It is therefore an object of the present invention to provide a polar modulation apparatus and method for obtaining and improved polar-modulated output signal with relatively high accuracy.

This object is achieved by a polar modulation apparatus wherein an analog signal corresponding to a derivate of the phase component of the polar-modulated signal is generated and used as an analog input signal for the controlled oscillator, e.g. VCO. Conversion is thus done in the analog domain so that additional aliasing, which increases the EVM can be prevented. Alternative polar modulation architecture can be provided, in which the controlled oscillator is driven with an analog derivative of the phase signal of the baseband signal.

As an example, the frequency modulator may comprise differentiating means for differentiating the in-phase component and the quadrature-phase component, and multiplying means for multiplying the differentiated in-phase component with the quadrature-phase component and for multiplying the differentiated quadrature-phase component with the in-phase component. Thereby, the derivative of the phase signal can be generated with simple analog circuits at reduced complexity. In particular, the frequency modulator may comprise subtractor for subtracting the output signals of the multiplying means. The differentiating means and the multiplying means may be analog circuits. As a specific example, the differentiating means may comprise an RC network. Furthermore, the controlled oscillator may be arranged in a PLL configuration and adapted to receive a PLL control signal generated at a phase detector of the PLL configuration. To this end, the PLL configuration may comprise adder for adding the PLL control signal to the analog signal. Thereby, the generation of the phase component of the polar-modulated signal is simply achieved by providing a second input terminal at the controlled oscillator so that the frequency generated by the PLL configuration is additionally modulated based on the derivative of the phase component.

To achieve quick locking of the PLL configuration with respect to the analog signal, supply means may be provided for temporarily supplying the analog signal directly to the phase detector when the PLL configuration is in an unlocked state. The additional control of the controllable oscillator may be achieved by applying the analog signal e.g. to a controllable or tunable capacitor or other frequency tuning element (s) of the controllable oscillator.

Thereby, the proposed modulation scheme can be implemented by merely providing a second controllable capacitor or other frequency tuning element(s) in the controllable oscillator. Providing squaring means for receiving the in-phase component and the quadrature-phase component, while the squaring means may for example comprise a non-linear element may generate the envelope signal. These measures also ensure simple analog implementations of the proposed polar modulation scheme. To prevent any offset at the control input of the controlled oscillator, coupling means may be used for providing an AC coupling between the frequency modulator and the input means. Additionally, amplitude-processing means may be provided for multiplying the amplitude of the analog signal by a squared inverse of the amplitude component. Thereby, any undesired amplitude components can be removed from the analog signal.

In a specific embodiment, the controlled oscillator and the output amplifier may be integrated to form a power oscillator. Thereby, circuit space can be reduced and efficient phase and amplitude control can be achieved to generate the polar-modulated output signal.

Further advantageous developments or modifications are defined in the dependent claims.

BRIEF DESCRIPTION OF THE DRAWINGS

The present invention will now be described based on preferred embodiments with reference to the accompanying drawings, in which.

DETAILED DESCRIPTION

The preferred embodiments will now be described in connection with a polar modulator arrangement which makes use of an IQ modulation in a wireless communication system, such as Bluetooth, UWB (Ultra-Wideband), WLAN (Wireless Local Area Network) or GSM EDGE (Global System for Mobile communication Enhanced Data rates for GSM Evolution).

Figure 1:
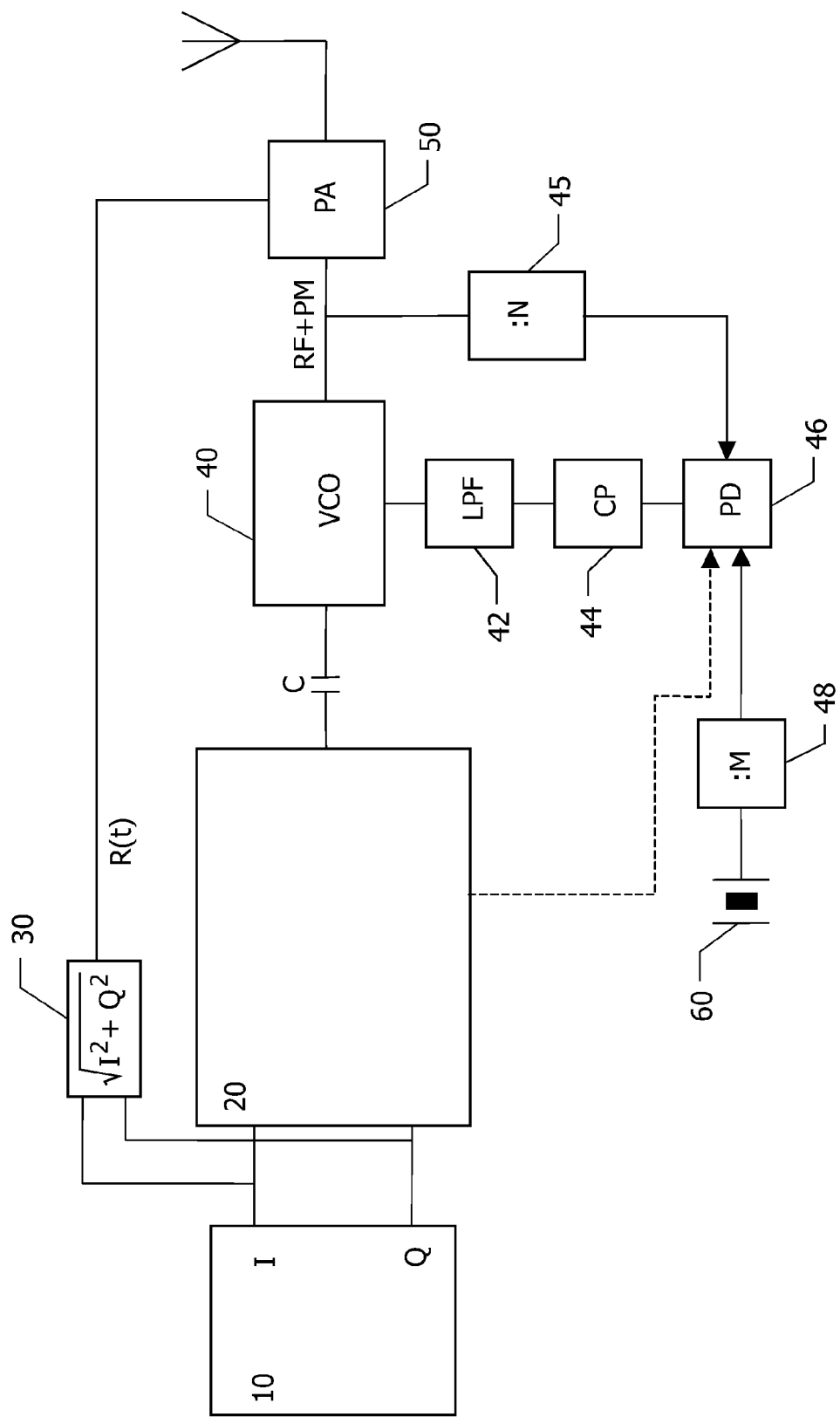
FIG. 1 shows a schematic block diagram of a polar modulator circuit according to a first preferred embodiment.

FIG. 1 shows a schematic block diagram of the proposed polar modulator circuit, wherein a digital baseband circuit 10 is provided for generating in-phase (I) and quadrature phase (Q) signals or components of an input signal. The I and Q signals are supplied to a frequency modulation (FM) modulator circuit 20 which generates a frequency-varying analog signal corresponding to the frequency content of the baseband signal reflected by the I and Q components. The frequency-varying signal is generated as the derivative of the phase obtained from the baseband signal. This analog output signal which corresponds to the derivative is supplied via an AC (alternate current) coupling element (e.g. capacitor C) to a voltage controlled oscillator (VCO) 40 of a PLL configuration consisting of blocks 42, 44, 45, 46 and 48 and to which a reference oscillator (e.g. a crystal oscillator) 60 is connected for supplying a reference frequency.

As can be gathered from FIG. 1, the VCO 40 comprises two control inputs, one for inputting the analog derivative of the phase obtained by the FM modulator 20 and the other for inputting a control signal obtained from a phase detector 46 of the PLL arrangement. The phase detector 46 receives a frequency-divided feedback signal, which has been divided by a value N. This frequency-divided feedback signal is compared to a frequency divided reference signal obtained from another frequency divider 48 where the reference signal of the reference oscillator 60 is divided by another value M. Thereby, the processing frequency can be kept low and the output frequency of the polar modulator can be adapted to the reference frequency of the reference oscillator 60.

The output of the phase detector 46 is supplied to one of the control inputs of the VCO 40 via a charge pump circuit 44 and a low pass filter 42 to provide a smooth and filtered control signal. Due to the fact that the VCO 40 is controlled by the PLL feedback signal obtained from the phase detector 46 and by the analog derivative of the phase obtained from the FM modulator 20, the output frequency of the VCO 40 comprises the radio frequency (RF) carrier modulated with the phase content of the baseband signal (RF+PM). This output signal of the VCO 40 is fed to the input of a power amplifier (PA) 50 to be amplified and supplied to an antenna for radio transmission.

To achieve the desired polar-modulated transmission signal, the bias current of the PA 50 is driven by an envelope signal R(t) of the baseband signal which has been generated by an analog squaring circuit 30 to which the I and Q input signals of the FM modulator 20 are also supplied. This re-composition of the envelope signal and the phase-controlled output signal RF+PM leads to the desired output spectrum at RF level.

In case the loop behavior of the PLL arrangement is not quick enough to lock to the output signal of the FM modulator 20 (PM signal) the output signal which corresponds to the derivative of the phase can be temporarily applied directly to the phase detector 46, as shown by the dotted arrow in FIG. 1. In the locked state, i.e. after locking to the output signal of the FM modulator 20, the output signal can be removed from the phase detector 46 and can be applied via the coupling capacitor C to the VCO 40.

Hence, both phase and envelope signals of the baseband signal are generated in the analog domain, so that bandwidth enlargement of the polar signals and resulting aliasing in the digital domain can be prevented.

Figure 2:
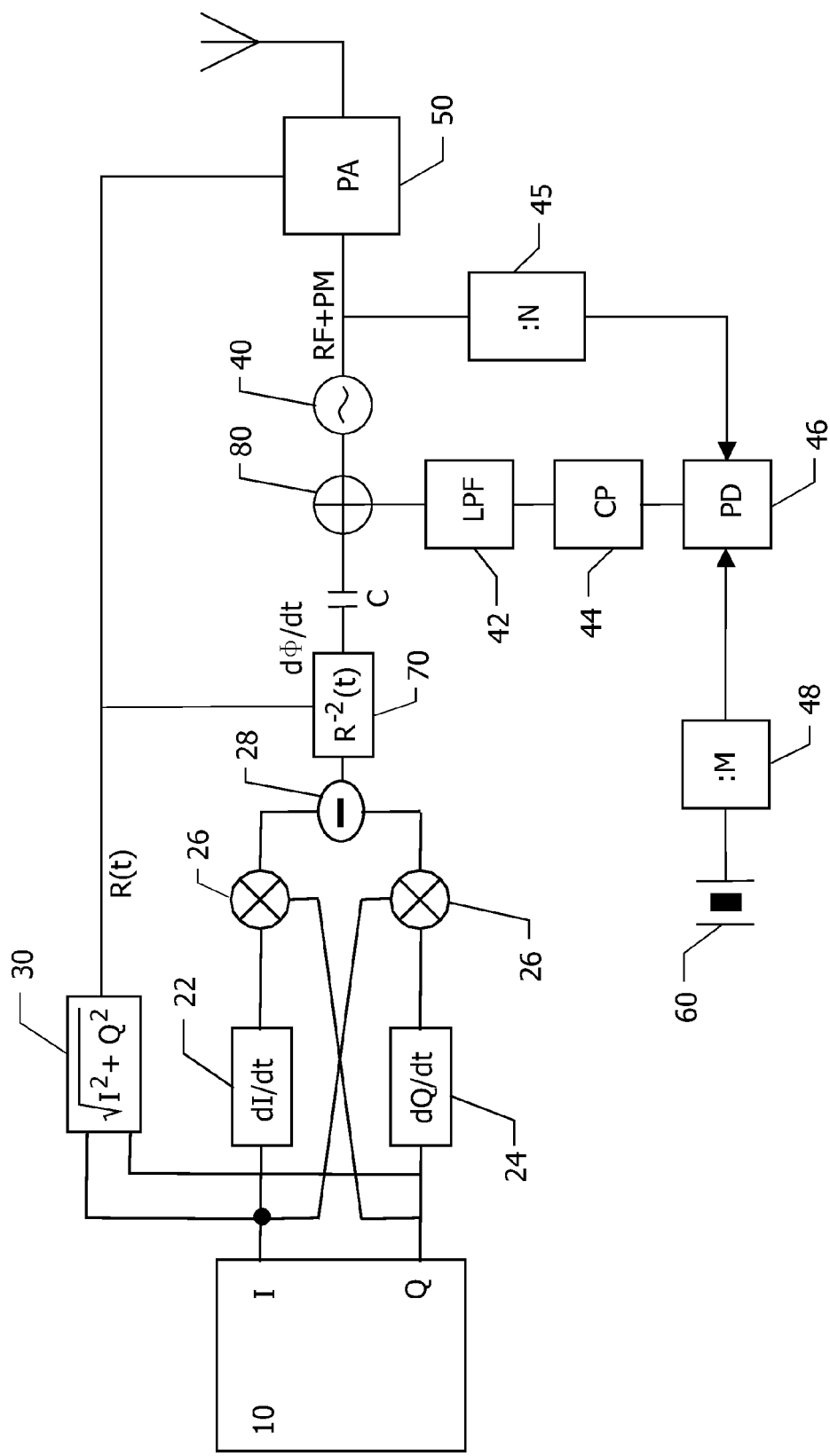
FIG. 2 shows a more detailed block diagram of an implementation example of the first preferred embodiment.

FIG. 2 shows a schematic circuit diagram of a more detailed implementation example of the first preferred embodiment, where the FM modulator 20 is implemented by a differentiate and multiply (DAM) circuit.

For reasons of brevity, the following discussion of the block diagram shown in FIG. 2 is restricted to the new elements or blocks with respect to the block diagram of FIG. 1. Features of FIG. 1, not shown in FIG. 2, may of course be provided there as well.

The DAM circuit of FIG. 2 comprises differentiating means 22, 24 and multiplying means 26 for differentiating with respect to time of the in-phase and quadrature-phase signals I and Q, so as to produce first and second differentiated signals dI/dt and dQ/dt, and for multiplying the signal dI/dt by the signal Q, and the signal dQ/dt by the signal I, to produce respective auxiliary signals. The auxiliary signals output by the two multipliers 26 is supplied to difference forming means, e.g. a subtractor 28, where a difference signal is formed from the auxiliary signals. This difference signal corresponds to a differentiated phase signal or a derivative of the phase which is however scaled by the carrier envelope R of the polar signal which corresponds to the vector sum of the I and Q signals. Thus, the difference signal can be expressed as follows:

$$I \cdot dQ/dt - Q \cdot dI/dt = R^2(t) \cdot d\Phi/dt$$

The subtractor 28 is connected to a processing or scaling circuit 70 to which the envelope signal R(t) at the output of the squaring circuit 30 is supplied, so as to generate a scaling factor $R^{-2}(t)$ which corresponds to the inverse of the square of the envelope signal. Thereby, any envelope components can be removed from the difference signal to obtain the correct derivative $d\Phi/dt$ of the baseband signal. This phase derivative $d\Phi/dt$ is supplied via the coupling capacitor C to an adding or summing element 80 where it is added to the processed control output of the phase detector 46 and the combined control signals are supplied to the VCO 40.

Thus, I and Q signals obtained from the digital baseband circuit or processor 10 are converted to the analog domain and a baseband envelope signal is obtained by passing the signals through a squaring circuit 30 which may comprise a non-linear device or element. The obtained envelope signal R(t) drives the bias current of the PA 50. To obtain the phase signal, the I and Q signals are passed through the respective differentiating circuits 22, 24, which may comprise an RC network. After that, the derivatives of the I and Q signals are multiplied by the Q and I signals, respectively, at the respective multipliers 26. Both results are subtracted at the subtractor 28 and scaled at the processing circuit 70 to obtain the derivative of the phase signal. As an example, a 2 MHz baseband signal may be used which is differential modulated ($\pi/4$-DQPSK), so that, consequently, these symbols are mapped on 1000 subcarriers creating an OFDM signal.

Figure 3:
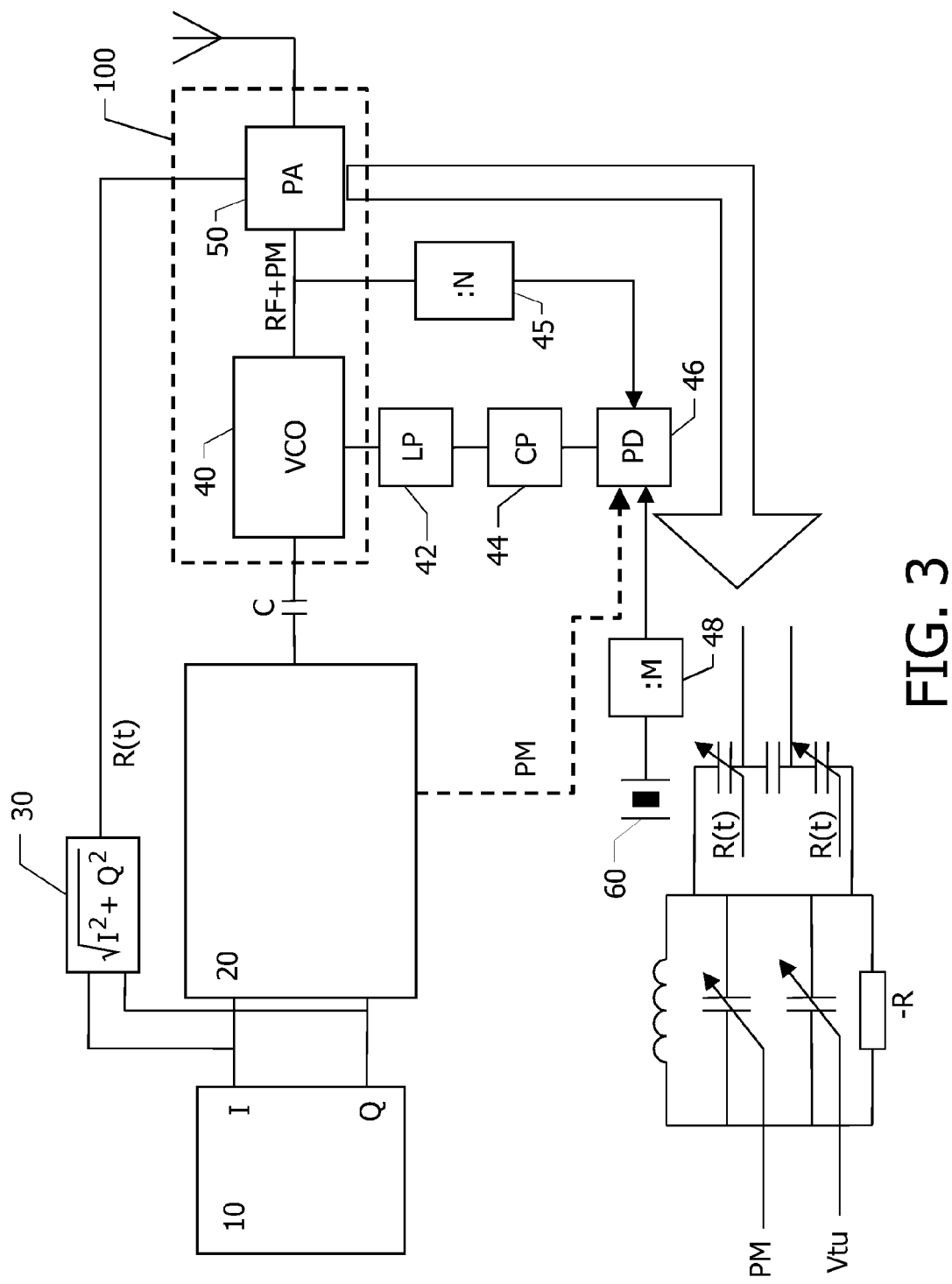
FIG. 3 shows a schematic block diagram of a second preferred embodiment with a power oscillator circuit.

FIG. 3 shows a schematic block diagram of a polar modulator arrangement according to the second preferred embodiment, which is based on the first preferred embodiment and comprises the additional feature that the VCO 40 and the PA 50 are integrated together to form a power VCO 100. This means, that only one amplifier circuit may be provided with a frequency determining circuitry and a bias adjusting circuitry as shown in the lower left portion of FIG. 3. According to this circuitry, the frequency is determined by a resonance circuit consisting of two adjustable or controllable capacitors, an inductor and an element reflecting a negative resistance (which can be implemented by an active element or a semiconductor element with a characteristic having a negative slope). As can be gathered from the left lower portion of FIG. 3, the VCO portion 40 of the power VCO 100 can be controlled by applying the phase derivative PM to the control terminal of the upper controllable capacitor, which may be for example a varactor diode or the like. Similarly, a tuning voltage Vtu obtained from the phase detector 46 and supplied to the VCO portion 40 can be applied to a control input of the lower controllable capacitor so that combined frequency control by the phase derivative PM and the tuning voltage Vtu can be achieved to obtain the modulated output signal RF+PM.

Additionally, bias tuning can be achieved by supplying the envelope signal R(t) to respective controllable capacitors (e.g. varactor diodes) of a serial capacitor circuit, while the output voltage at the right end of the adjusting circuitry at left lower left portion of FIG. 3 forms an output voltage of the power VCO 100.

According to the proposed polar modulation scheme, phase and amplitude signals are generated in the analog domain so as to prevent bandwidth increase, while the phase signal is obtained by an analog FM modulator, which can be based for example on a differentiate and multiply algorithm in the analog domain. The obtained derivative of the phase signal is used for controlling a controlled oscillator, such as a VCO, for phase modulation in the polar modulator. Thereby, a highly accurate polar-modulated output signal can be obtained.

In summary the present invention relates to a polar modulation apparatus and method, in which an in-phase and a quadrature-phase signal are processed in the analog domain to generate an analog signal corresponding to a derivative of a phase component of said polar-modulated signal. The analog signal is then input to a control input of a controlled oscillator. The phase and envelope signals are thereby generated in the analog domain and bandwidth enlargement due to the processing of the polar signals and corresponding aliasing can be prevented to obtain a highly accurate polar-modulated output signal. It is however noted that the present invention is not restricted to the above preferred embodiments, but can be applied to any polar modulation architecture which is based on I, Q signals and which comprises a controllable oscillator circuit.

Finally but yet importantly, it is noted that the term "comprises" or "comprising" when used in the specification including the claims is intended to specify the presence of stated features, means, steps or components, but does not exclude the presence or addition of one or more other features, means, steps, components or group thereof. Further, the word "a" or "an" preceding an element in a claim does not exclude the presence of a plurality of such elements. Moreover, any reference sign does not limit the scope of the claims.

What is claimed is:

1. A polar modulation apparatus in which a phase component of an input signal is used for tuning a controlled oscillator and an amplitude component of said input signal is used for modulating an output amplifier, said apparatus comprising:
 a frequency modulator configured to receive an in-phase component and a quadrature-phase component of said input signal and configured to process said in-phase and quadrature-phase components in the analog domain to generate an analog signal corresponding to a derivative of said phase component; and
 an input configured to input said analog signal to a control input of said control oscillator.

2. An apparatus according to claim 1, wherein said frequency modulator comprises a differentiating component configured to differentiate said in-phase component and said quadrature-phase component, and a multiplying component configured to multiply the differentiated in-phase component with said quadrature-phase component and to multiply the differentiated quadrature-phase component with said in-phase component.

3. An apparatus according to claim 2, wherein said frequency modulator comprises a subtractor configured to subtract the output signals of said multiplying component.

4. An apparatus according to claim 2, wherein said differentiating component and said multiplying component are analog circuits.

5. An apparatus according to claim 2, wherein said differentiating component comprises an RC network.

6. An apparatus according to claim 1, wherein said control oscillator is included in a phase locked loop, the control oscillator configured to receive a PLL control signal generated at a phase detector of said phase locked loop.

7. An apparatus according to claim 6, wherein the phase locked loop comprises an adder configured to add said phase controlled loop control signal to said analog signal.

8. An apparatus according to claim 6, further comprising a supply component configured to temporarily supply said analog signal to said phase detector when said phase locked loop configuration is in an unlocked state.

9. An apparatus according to claim 1, wherein said analog signal is applied to a controllable capacitor of said controllable oscillator.

10. An apparatus according to claim 1, further comprising a squaring component configured to receive said in-phase component and said quadrature-phase component and to generate an envelope signal corresponding to said amplitude component.

11. An apparatus according to claim 10, wherein said squaring component comprises a non-linear element.

12. An apparatus according to claim 1, further comprising a coupling component configured to provide an alternate current coupling between said frequency modulator and said input.

13. An apparatus according to claim 1, further comprising an amplitude processing component configured to multiply the amplitude of said analog signal by a squared inverse of said amplitude component.

14. An apparatus according to claim 1, wherein said controlled oscillator and said output amplifier are integrated to form a power oscillator.

15. A method of producing a polar-modulated signal, said method comprising the steps of:
    providing an in-phase signal and a quadrature-phase signal;
    processing said in-phase and quadrature-phase signal in the analog domain to generate an analog signal corresponding to a derivative of a phase component of said polar-modulated signal; and
    inputting said analog signal to a control input of a controlled oscillator.

16. A polar modulation apparatus in which a phase component of an input signal is used for tuning a controlled oscillator and an amplitude component of the input signal is used for modulating an output amplifier, the apparatus comprising:
    a frequency modulator configured to receive an in-phase component and a quadrature-phase component of the input signal, and to generate an analog signal corresponding to a derivative of the phase component; and
    an input configured to input the analog signal to a control input of the control oscillator,
    wherein the analog signal is generated by processing the in-phase component and the quadrature-phase component in the analog domain.

17. An apparatus according to claim 16, wherein the frequency modulator comprises a differentiating component configured to differentiate the in-phase component and the quadrature-phase component, and a multiplying component configured to multiply the differentiated in-phase component with the quadrature-phase component and to multiply the differentiated quadrature-phase component with the in-phase component.

18. An apparatus according to claim 17, wherein the frequency modulator comprises a subtractor configured to subtract the output signals of the multiplying component.

19. An apparatus according to claim 17, wherein the differentiating component and the multiplying component are analog circuits.

20. An apparatus according to claim 17, wherein the differentiating component comprises an RC network.

* * * * *